United States Patent
Hokuto et al.

(10) Patent No.: US 7,839,592 B2
(45) Date of Patent: Nov. 23, 2010

(54) MAGNETIC HEAD DRIVING CIRCUIT WITH PROTECTION FUNCTION

(75) Inventors: Shingo Hokuto, Kyoto (JP); Yujiro Okamoto, Kyoto (JP)

(73) Assignee: Rohm Co., Ltd. (JP)

( * ) Notice: Subject to any disclaimer, the term of this patent is extended or adjusted under 35 U.S.C. 154(b) by 793 days.

(21) Appl. No.: 11/666,274

(22) PCT Filed: Sep. 29, 2005

(86) PCT No.: PCT/JP2005/017983

§ 371 (c)(1),
(2), (4) Date: Apr. 25, 2007

(87) PCT Pub. No.: WO2006/046380

PCT Pub. Date: May 4, 2006

(65) Prior Publication Data

US 2009/0135524 A1  May 28, 2009

(30) Foreign Application Priority Data

Oct. 25, 2004  (JP) ............................. 2004-309045

(51) Int. Cl.
*G11B 5/03*  (2006.01)
(52) U.S. Cl. ............................... 360/66; 360/65; 360/67
(58) Field of Classification Search ........................ None
See application file for complete search history.

(56) References Cited

U.S. PATENT DOCUMENTS 5,357,379 A * 10/1994 Gower .......................... 360/46
6,552,879 B2 * 4/2003 Voldman ..................... 360/323
6,574,078 B1 * 6/2003 Voldman ..................... 360/323
6,836,391 B2 * 12/2004 Kanda ......................... 360/323
6,891,702 B1 * 5/2005 Tang ........................... 360/323
6,920,002 B2 * 7/2005 Sako et al. .................... 360/46
2002/0060888 A1  5/2002 Kanda

FOREIGN PATENT DOCUMENTS

JP  59-126326  7/1984

(Continued)

OTHER PUBLICATIONS

International Preliminary Report on Patentability for International Application No. PCT/JP2005/017983 dated May 1, 2007.

(Continued)

*Primary Examiner*—Jason C Olson
(74) *Attorney, Agent, or Firm*—Cantor Colburn LLP (57) ABSTRACT

A magnetic recording and reproducing device is a hard disk device which writes information onto a magnetic disk (not shown), or reads information therefrom, and includes: a reproducing head; a recording head; and a magnetic head driving circuit. The magnetic head driving circuit is a circuit, by which driving of the reproducing head and the recording head is controlled, and onto which the reproducing head, a recording head driving circuit, a control unit, and a variable impedance element are integrated. This magnetic head driving circuit is switched on a time division base to a read mode during reproducing operation, and to a write mode during recording operation. The control unit reduces the impedance of the variable impedance element during the write mode.

10 Claims, 4 Drawing Sheets

FOREIGN PATENT DOCUMENTS

| | | |
|---|---|---|
| JP | 5-197927 | 8/1993 |
| JP | 05197927 A * | 8/1993 |
| JP | 6-176558 | 6/1994 |
| WO | WO 00/79522 A1 | 12/2000 |

OTHER PUBLICATIONS

International Search Report for International Application No. PCT/JP2005/017983 dated Nov. 1, 2005.

Chinese Office Action for Chinese Application No. 200580035047.0 issued Apr. 3, 2009 with English translation.

Japanese Office Action for Japanese Patent Application No. 2004-309045 mailed Jun. 16, 2009 with English translation.

Chinese Office Action for Chinese Patent Application No. 200580035047.0 issued Aug. 1, 2008 with English Translation.

* cited by examiner

PRIOR ART

MAGNETIC HEAD DRIVING CIRCUIT WITH PROTECTION FUNCTION

CROSS REFERENCE TO RELATED APPLICATIONS

This is a U.S. national stage of application No. PCT/JP2005/017983, filed on 29 Sep. 2005. Priority under 35 U.S.C. §119(a) and 35 U.S.C. §365(b) is claimed from Japanese Application No. 2004-309045, filed 25 Oct. 2004, the disclosure of which is also incorporated herein by reference.

BACKGROUND OF THE INVENTION

1. Field of the Invention

The present invention relates to a magnetic recording and reproducing device which records data on a magnetic recording medium, and reproduces the data, and, more particularly, to a technology for protecting a reproducing head.

2. Description of the Related Art

Recently, the magnetic recording and reproducing device such as a hard disk has been utilized as a recording medium used in an electronic equipment in many cases. In such a magnetic recording and reproducing device, a magneto resistive (MR) element is used for a head reproducing data which has been magnetically recorded. As a value of resistance in the MR element is changed by a change in a magnetic flux, a voltage between the both ends is measured under a state in which a predetermined bias current is passed through the element, and information recorded in the magnetic recording medium may be read in the form of the converted voltages.

It has been known that such an MR element has a low breakdown voltage, and is easily affected by noise such as static electricity (Patent Document 1). On the other hand, a giant magneto resistive (GMR) element, a tunneling magneto resistive (TMR) element, and the like, which may realize more integration, have been used as the capacity of the magnetic recording and reproducing device increases. However, the above elements have a further low breakdown voltage to present an important problem that a protection technology for the elements is required.

[Patent Document 1] Japanese Patent Application Laid-open No. 6-176558.

A magnetic recording and reproducing device provided with the above-described MR element has had the following problems.

Figure 6:
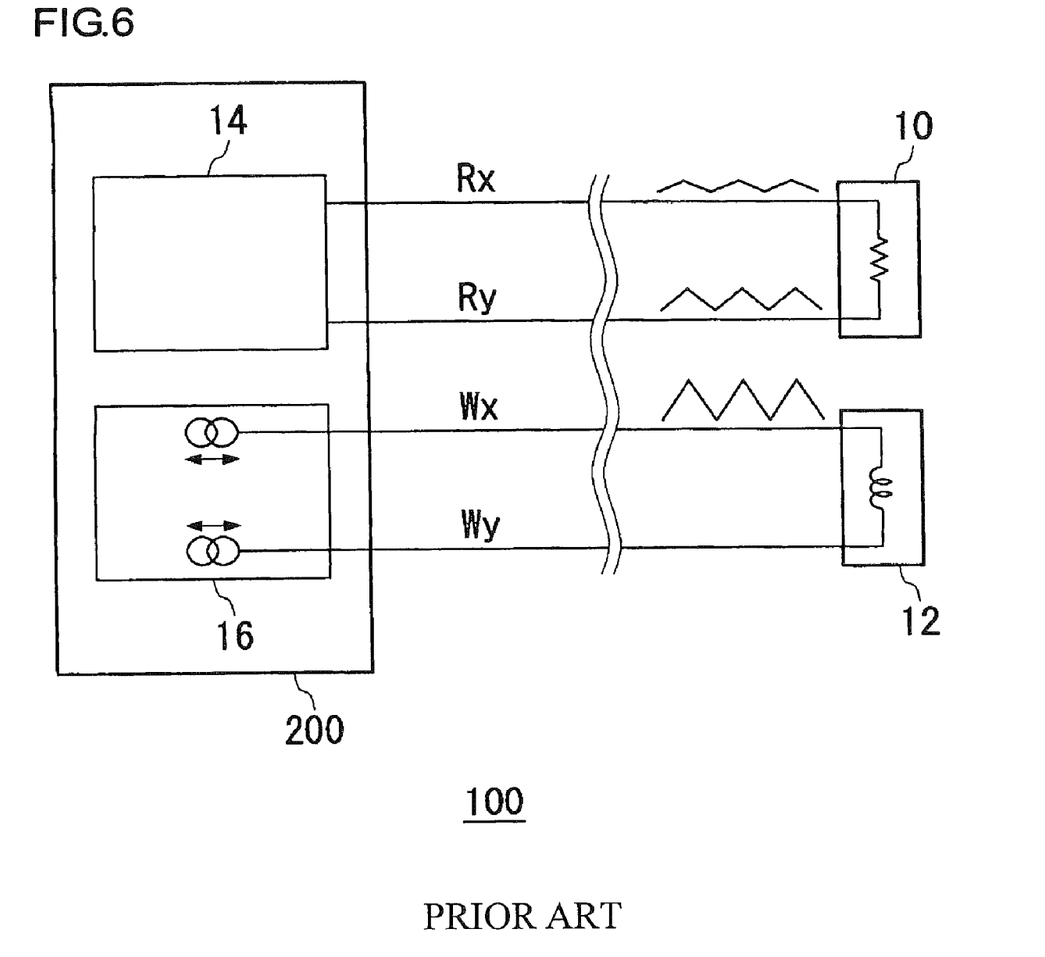
FIG. 6 is a view showing a configuration in the vicinity of a head in a commonly-used magnetic recording and reproducing device.

FIG. 6 shows a configuration in the vicinity of a head in a commonly used magnetic recording and reproducing device. As shown in FIG. 6, a magnetic recording and reproducing device 100 is provided with a reproducing head 10, a recording head 12, and a magnetic head driving circuit 200 which supplies a bias current to the both heads. The magnetic head driving circuit 200 includes a reproducing head driving circuit 14 and a recording head driving circuit 16, wherein the circuits are integrated.

In many cases, there has been applied a configuration in which while the reproducing head 10 and the recording head 12 are provided in the vicinity of a hard disk as a magnetic recording medium, the magnetic head driving circuit 200 is provided at a position away from the heads, and four interconnections Rx, Ry, Wx, and Wy are routed therebetween. As these interconnections are routed over a distance of several centimeters under a state in which the interconnections are adjacent to each other, each of parasitic capacitances between the interconnections can not be neglected.

Here, when recording operation is operated in the magnetic recording and reproducing device 100, the recording head driving circuit 16 switches, at high speed, a write current passing through the recording head 12, and there are caused crosstalks of the above write current into the interconnections Rx and Ry on the side of the reproducing head 10 through each of the parasitic capacitances between the above-described interconnections. Thus, a voltage between the both ends of the reproducing head 10 is changed according to the switching of the write current during recording operation. Accordingly, there may be a great possibility that the life and the reliability of the reproducing head 10 are affected.

Here, there may be considered a method by which a constant current source, which supplies a constant current to the reproducing head 10, is grounded at recording operation, and potentials of the both ends of the reproducing head 10 is fixed in order to protect the reproducing head 10. However, the above method has had a problem that, when operation is shifted to the reproducing operation, it takes time to reset the constant current source and high-speed recording and reproducing are obstructed. Moreover, when a circuit is provided for high-speed resetting, the size of the circuit is increased.

SUMMARY OF THE INVENTION

The present invention has been made, in view of the above problems, and its general purpose is to provide a technology by which a reproducing head is protected in a magnetic recording and reproducing device without affecting the circuit operation.

An embodiment of the present invention relates to a magnetic head driving circuit. This magnetic head driving circuit includes: a first and a second terminals each of which is to be connected to either of the ends of a reproducing head element; a variable impedance element which is connected to between the first and the second terminals in parallel with the reproducing head element; and a control unit which controls the impedance of the variable impedance element. The control unit reduces the impedance of the variable impedance element during recording operation.

According to the above embodiment, the reproducing head element may be protected in the magnetic head driving circuit used for the magnetic recording and reproducing device by a configuration in which the effective resistance between the first and the second terminals may be reduced, that is, the voltage applied to the reproducing head element may be reduced by reducing the impedance of the variable impedance element provided in parallel with the reproducing head element during the recording operation.

The impedance of the variable impedance element during recording operation may be set similar to, equal to, or smaller than that of the reproducing head element.

The variable impedance element may be a MOS transistor in which the drain is connected to the first terminal, the source is connected to the second terminal, and the gate is connected to the control unit.

By the control unit, the transistor may be turned on by increasing a voltage between the gate and the source of the MOS transistor to a value larger than a threshold voltage during recording operation, and a resistance corresponding to the on resistance of the transistor is inserted between the first and the second terminals. Thus, the reproducing head element may be protected because a part of a current passing through the reproducing head element passes through the MOS transistor during recording operation. Moreover, an influence on the circuit may be reduced during reproduction operation because the resistance of the MOS transistor is very high when the transistor is turned off.

The variable impedance element includes: a P type MOS transistor in which the drain is connected to the first terminal, the source is connected to the second terminal, and the gate is connected to the control unit; and an N type MOS transistor in which the source is connected to the first terminal, the drain is connected to the second terminal, and the gate is connected to the control unit.

The reproducing head element may be more reliably protected because, even when the first and the second terminal are set at any value of potentials, at least one of the MOS transistors may be turned on by connecting the P type MOS transistor in parallel with the N type MOS transistor between the first and the second terminals.

Another embodiment of the present invention is a magnetic head driving circuit. The magnetic head driving circuit includes: a first and a second terminals each of which is to be connected to either of the ends of a reproducing head element; and a voltage clamping element connected to between the first and the second terminals in parallel with the reproducing head element, and the voltage clamping element is operated in such a way that a voltage applied to the reproducing head element becomes a predetermined voltage or less during recording operation.

According to the above embodiment, the reproducing head element may be protected because a voltage exceeding a predetermined voltage is prevented from being applied to the reproducing head element even when the current signal supplied to the recording head during recording operation is mixed into the side of the reproducing head side by the crosstalks.

Another embodiment of the present invention is a magnetic recording and reproducing device. This device is provided with the above-described magnetic head driving circuit.

Further another embodiment of the present invention is a method of protecting a reproducing head in a magnetic recording and reproducing device which records data on a magnetic recording medium, and reproduces the data. In the method of protecting a reproducing head, the impedance between the both ends of a reproducing head element is reduced during recording operation.

According to the above embodiment, the reproducing head element may be protected because the impedance is low even when a current caused by crosstalks and the like passes through the side of the reproducing head during recording operation, and the voltage drop between the both ends of the reproducing head may be suppressed small.

It is to be noted that any arbitrary combination or rearrangement of the above-described structural components and so forth is effective as and encompassed by the present embodiments.

Moreover, this summary of the invention does not Necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
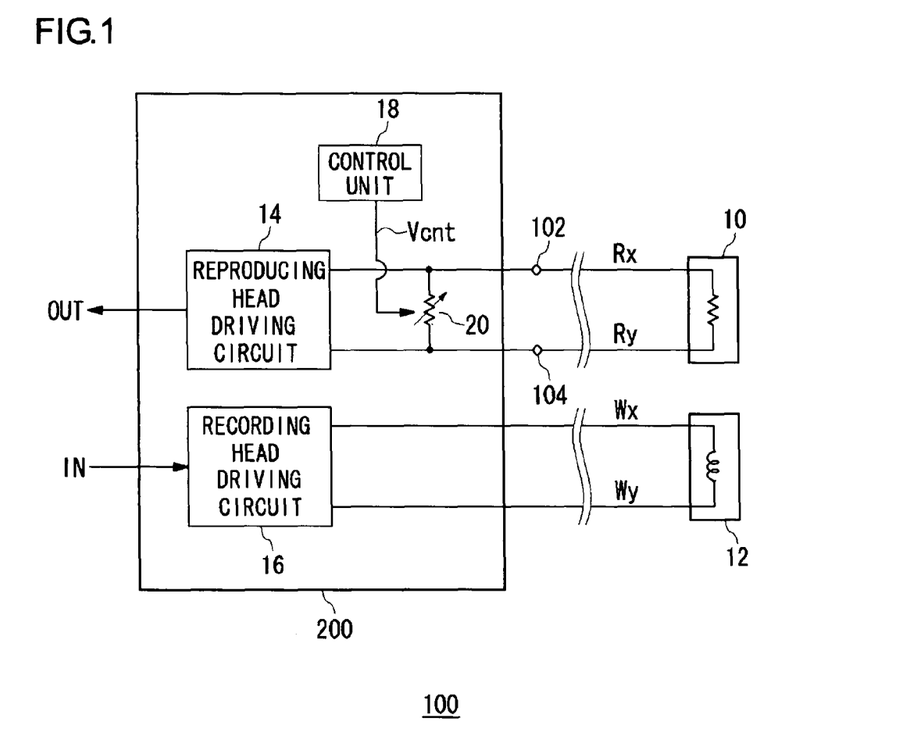
FIG. 1 is a circuit diagram showing a configuration of a magnetic recording and reproducing device according to an embodiment.

FIG. 1 is a circuit diagram showing a configuration of a magnetic recording and reproducing device 100 according to an embodiment. This magnetic recording and reproducing device 100 is a hard disk device which writes information on a magnetic disk (not shown), or reads information from the magnetic disk, and includes: a reproducing head 10; a recording head 12; and a magnetic head driving circuit 200.

In this magnetic recording and reproducing device 100, a coil is installed in the recording head 12, and is arranged in the vicinity of the magnetic disk which rotates at high speed. Information is written into the magnetic disk by a configuration in which a signal current, which is corresponding to information to be recorded, is applied to the coil in the recording head 12 to generate an induction field, and the magnetic disk is magnetized by a magnetic flux which is leaked from a magnetic gap.

The reproducing head 10 includes an MR element in which the resistance is changed according to a magnetic flux, and the resistance is changed by a magnetic flux generated from the magnetic disk which has been magnetized according to the written information. Accordingly, a magnetic signal may be read after the signal is converted into an electric signal.

The magnetic head driving circuit 200 is a circuit by which driving of the reproducing head 10 and the recording head 12 is controlled, and has a configuration in which a reproducing head driving circuit 14, a recording head driving circuit 16, a control unit 18, and a variable impedance element 20 are integrated. This magnetic head driving circuit 200 is switched on a time division base to a read mode during reproducing operation, and to a write mode during recording operation.

The recording head driving circuit 16 is connected to the recording head 12 through writing interconnections Wx and Wy. The recording head driving circuit 16 becomes active during the write mode, and controls a current passing through the recording head 12 according to information written on the magnetic disk.

A first terminal 102 and a second terminal 104 which are corresponding to an input or output terminal in the reproducing head driving circuit 14, are connected to the reproducing head 10 through reading interconnections Rx and Ry. The reproducing head driving circuit 14 becomes active during the read mode, and supplies a constant bias current Ibias to the reproducing head 10. The resistance of the MR element in the reproducing head is changed, depending on the magnetic flux of the magnetic disk, and, when the resistance is assumed to be Rmr, the voltage drop Vmr between the both ends of the reproducing head 10 is given by the following formula: Vmr=Rmr×Ibias. Usually, the resistance of the MR element is of the order of several tens ohms, and a voltage drop of the order of 0.1 volts to 1 volt may be obtained by applying a bias current of several milliamperes. The reproducing head driving circuit 14 extracts information written on the magnetic disk as an electric signal by differential amplification of the voltage drop of the reproducing head 10, that is, a voltage between the first terminal 102 and the second terminal 104.

The reading interconnections Rx and Ry are laid from the magnetic head driving circuit 200 to the reproducing head 10 on a flexible printed circuit (FPC) in parallel with each other, and the writing interconnections Wx and Wy are laid from the magnetic head driving circuit 200 to the recording head 12 on the FPC in parallel with each other. Accordingly, each of the parasitic capacitances (not shown) exists between the interconnections.

The variable impedance element 20 is provided between the first terminal 102 and the second terminal 104, and the impedance of the element 20 is changed according to a control signal Vcnt input from the control unit 18. The control unit 18 outputs the control signal Vcnt to the variable impedance element 20, and the impedance of the variable impedance element 20 is set high during the read mode, and is set low during the write mode.

Figure 2:
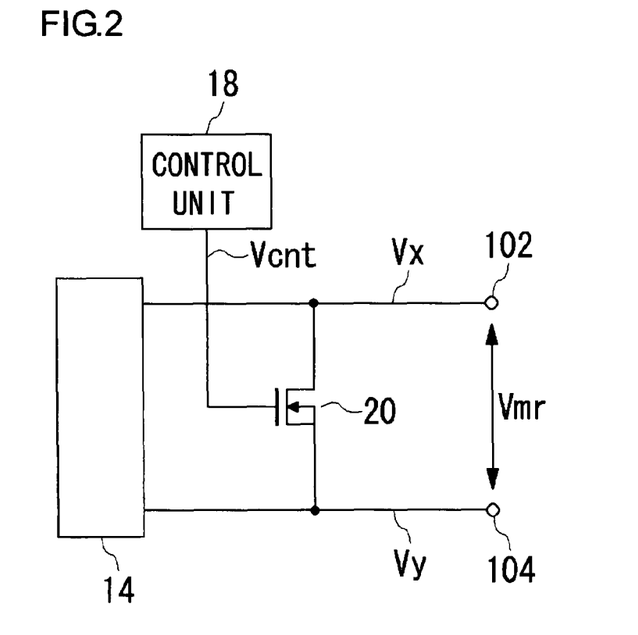
FIG. 2 is a circuit diagram showing a configuration of a variable impedance element.

FIG. 2 is a circuit diagram showing a configuration of the variable impedance element 20. When the voltage of the first terminal 102 is assumed to be Vx, and that of the second terminal 104 is assumed to be Vy during the write mode, the following relation holds true: Vx−Vy=Vmr.

In FIG. 2, the variable impedance element 20 is formed with an N type MOS transistor. In the MOS transistor, the drain is connected to the first terminal 102, and the source is connected to the second terminal 104, while the control signal Vcnt output from the control unit 18 is input to the gate.

The control unit 18 outputs a high-level signal during the write mode, and a low-level signal during the read mode as the control signal Vcnt. When the high level signal is output as the control signal Vcnt, and the following relation holds true: Vcnt−Vy>Vt, the MOS transistor as the variable impedance element 20 is turned on. Here, Vt is a gate-source threshold voltage of the MOS transistor.

The gate length and the gate width of the MOS transistor are set in such a way that the on-resistance Ron between the drain and the source are similar to, equal to, or smaller than the resistance Rmr of the reproducing head 10 connected to between the first terminal 102 and the second terminal 104.

The variable impedance element 20 shown in FIG. 2 may be formed with a P type MOS transistor. In this case, the source is connected to the first terminal 102, and the drain is connected to the second terminal 104. A low-level signal is output during the write mode, and a high-level signal is output during the read mode from the control unit 18 as the control signal Vcnt. When the low level signal is output as the control signal Vcnt, and the following relation holds true: Vx−Vcnt>Vt, the MOS transistor as the variable impedance element 20 is turned on.

Figure 3:
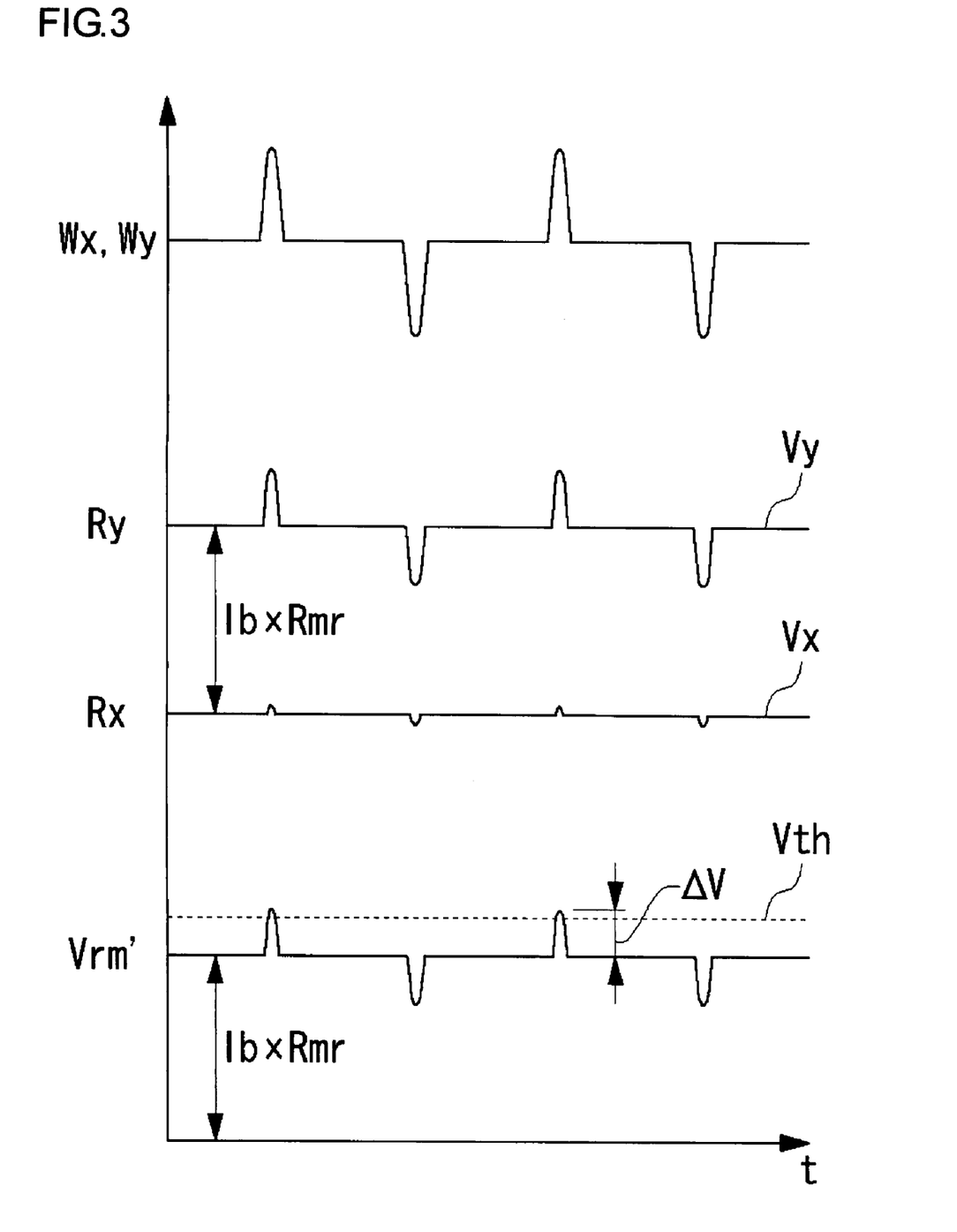
FIG. 3 is a view showing signal waveforms of interconnections Rx, Ry, Wx, and Wy during the write mode in a case in which the variable impedance element is not operated.

The magnetic head driving circuit 200 and the magnetic recording and reproducing device 100, which have the above-described configuration, will be explained. For clarity of the effect according to the present invention, a case in which the variable impedance element 20 does not work will be explained in the first place. FIG. 3 shows signal waveforms of the interconnections Rx, Ry, Wx, and Wy during the write mode in the case in which the variable impedance element 20 is not operated.

In FIG. 3, time is shown in abscissa, and currents and voltages are shown in ordinate. The scales of the ordinate and the abscissa are expanded or reduced as required for better visibility, and are different from the actual ones.

During the write mode, a current the direction of which is inverted is configured to pass through the recording head 12 according to the data written on the magnetic disk. Accordingly, signals appearing in the writing interconnections Wx and Wy have time waveforms which are changed according to the directions of the currents as shown in FIG. 3.

On the other hand, a constant bias current Ib is supplied from the reproducing head driving circuit 14 to the reproducing head 10 through the reading interconnections Rx and Ry during the write mode. As the reproducing head 10 is not influenced by the magnetic field of the magnetic disk during the write mode, the resistance Rmr of the reproducing head 10 becomes a constant value. Accordingly, any of the voltage waveforms Vx and Vy of the reading interconnections Rx and Ry is to be a constant value.

However, as the reading interconnections Rx and Ry, and the writing interconnections Wx and Wy are provided in such a way that the above interconnections are adjacent to each other, c signal components of the writing interconnections Wx and Wy are coupled to the reading interconnections Rx and Ry, through the parasitic capacitances between the interconnections. As a result, a signal component propagating on the writing interconnection Wx appears in the reading interconnections Rx and Ry as shown in FIG. 3. Here, as a parasitic capacitance between interconnections is in inverse proportion to a distance therebetween, the reading interconnection Ry nearer to the writing interconnection Wx has a larger signal component, and, conversely, the reading interconnection Rx at a remoter position has a smaller amplitude.

The voltage Vmr between the first terminal 102 and the second terminal 104 is given by the sum of a direct current component Ib×Rmr caused by the bias current Ib and a signal component, which is shown by ΔV in the drawing, generated by the crosstalk between the interconnections, as shown in FIG. 3. This voltage Vmr between the first terminal 102 and the second terminal is applied to the reproducing head 10. When a voltage Vth shown by a dashed line in FIG. 3 is assumed to be a breakdown voltage of the reproducing head 10, and a large signal caused by a crosstalk between the interconnections is coupled, a voltage exceeding the breakdown voltage of the MR element in the reproducing head 10 is generated to generate a possibility that an influence is exerted upon the reliability of the reproducing head 10.

In order to protect the reproducing head 10, a voltage applied to the reproducing head 10 is controlled, using the variable impedance element 20, in the magnetic recording and reproducing device 100, which is shown in FIG. 1 and FIG. 2, according to the present embodiment. Hereinafter, the operation will be explained.

As the control unit 18 outputs the low level signal as the control signal Vcnt during the read mode, the MOS transistor as the variable impedance element 20 is turned off. As the impedance between the drain and the source of the MOS transistor is orders of magnitude greater than that of the impedance of the reproducing head 10 at this time, the influence may not be neglected at reading.

When the mode is switched from the read mode to the write one, the control unit 18 switches the control signal Vcnt to a high level signal. As a result, the MOS transistor as the variable impedance element 20 is turned on, and the impedance between the drain and the source becomes an on resistance Ron. As a result, an element with a resistance Ron is connected to the first terminal 102 and the second terminal 104 in FIG. 2. That is, the impedance Zr between the first terminal 102 and the second terminal 104 is obtained by the following formula: Zr=Rmr×Ron/(Rmr+Ron) during the writing mode. Here, for example, when the on resistance Ron of the MOS transistor is assumed to be equal to the impedance Rmr of the reproducing head 10, the impedance Zr between the first terminal 102 and the second terminal 104 is obtained by the following formula: Zr=Rmr/2, and is halved as compared to the value of a case in which the variable impedance element 20 is not provided.

Figure 4:
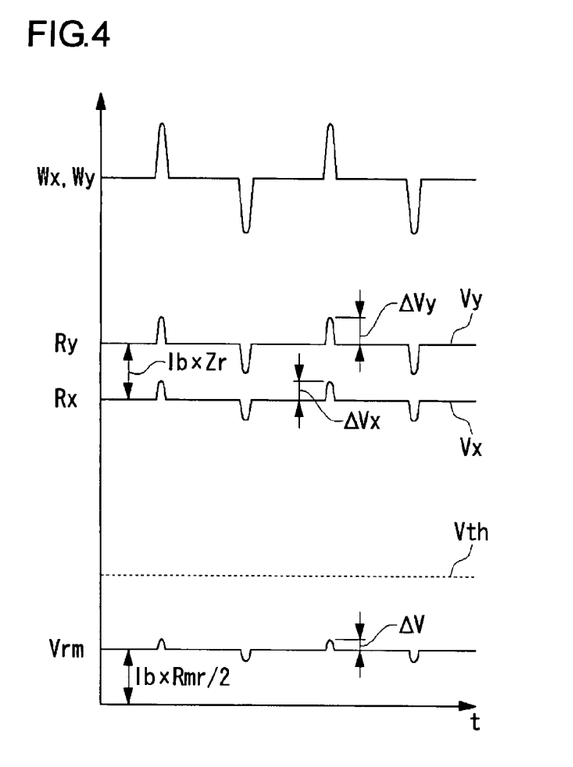
FIG. 4 is a view showing signal waveforms of the interconnections Rx, Ry, Wx, and Wy during the write mode in a case in which the variable impedance element is operated in the magnetic recording and reproducing device according to the embodiment.

FIG. 4 shows signal waveforms of the interconnections Rx, Ry, Wx, and Wy during the write mode in the case in which the variable impedance element 20 is operated in the magnetic recording and reproducing device 100 according to the present embodiment.

The voltage Vx of the reading interconnection Rx and the voltage Vy of the reading interconnection Ry are coupled to the signals from the writing interconnections Wx and Wy in the similar manner as that of FIG. 3, and the signal components appear therein.

Here, the potential difference between the reading interconnections Rx and Ry is noted. During the write mode, the impedance between the first terminal 102 and the second terminal 104 is halved as compared to the value of a case, in which the variable impedance element 20 is not operated, as described above. Thereby, the direct current component of the voltage Vmr applied to between the first terminal 102 and the second terminal 104, that is, the voltage applied to between the both ends of the reproducing head 10 is expressed by the following formula: Vmr=Ib×Zr=Ib×Rmr/2, and the value of Vmr is halved as compared to the value, which is shown in FIG. 3, of a case in which the variable impedance element 20 is not provided.

Furthermore, as the impedance between the first terminal 102 and the second terminals 104 becomes low, amplitudes, ΔVx and ΔVy, of signal components coupled from the writing interconnections Wx and Wy to the reading interconnections Rx and Ry are almost the same as each other. At this time, the amplitude of a signal component ΔV generated by a crosstalk between the interconnections also becomes small among voltage Vmr applied to between the both ends of the reproducing head 10.

As a result, a voltage exceeding the breakdown voltage of the MR element in the reproducing head 10 may be prevented from being generated, and the reproducing head 10 may be protected even when a large signal is coupled by a crosstalk between the interconnections from the writing interconnections Wx and Wy to the reading interconnections Rx and Ry, because the potential difference Vmr between the first terminal 102 and the second terminal 104 becomes lower than the breakdown voltage Vth, which is shown by the dashed line, of the reproducing head 10.

As described above, by the magnetic recording and reproducing device 100 according to the present embodiment, a current passing through the reproducing head 10 is decreased by providing the variable impedance element between the first terminal 102 and the second terminals 104, to which the reproducing head 10 is connected, and by reducing the impedance to the element during the write mode in which the reproducing head 10 is not used, and the applied voltage may be limited, that is, the reproducing head 10 may be protected.

Moreover, the operation of the constant current source in the reproducing head driving circuit 14 is not required to be stopped according to the present embodiment, because the bias current Ib is continuously supplied to the reproducing head 10 even during the write mode. Thereby, the mode is quickly shifted to the read mode because there is no time delay caused by restarting of the constant current source at the time of switching from the write mode to the read mode.

The switching time between the write mode and the read mode influences on a speed at which data is written onto, or is read from the magnetic disk. As compared to time of several microseconds conventionally required when a constant current source in the reproducing head driving circuit 14 is stopped and started, time required for switching the impedance becomes of the order of hundreds of nanoseconds or less when the MOS transistor is used as the variable impedance element 20 as described in the magnetic recording and reproducing device 100 according to the present embodiment. Accordingly, recording and reproducing may be switched in a shorter time as compared to a conventional case, and the reproducing head 10 may be protected without causing reduction in the speed of the magnetic recording and reproducing device 100.

It will be appreciated by persons skilled in the art that the above-described embodiments are to be considered as illustrative, and various modifications to the combinations of the components and the processes in the above embodiments may be made within the scope of the present embodiment.

Figure 5:
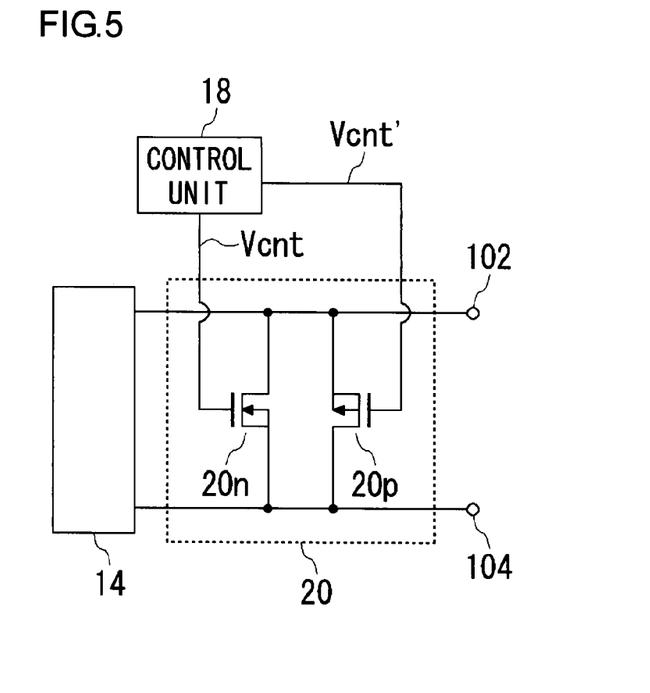
FIG. 5 is a circuit diagram showing a variation of the configuration of the variable impedance element.

For example, another configuration shown in FIG. 5 may be applied, though the variable impedance element 20 has been formed with a single MOS transistor in the above-described embodiments. FIG. 5 is a circuit diagram showing a variation of the configuration of the variable impedance element 20. In the variation shown in FIG. 5, the variable impedance element 20 includes an N type MOS transistor 20n and a P type MOS transistor 20p.

In the P type MOS transistor 20p, the drain is connected to the first terminal 102, and the source is connected to the second terminal 104. Moreover, the source is connected to the first terminal 102, and the drain is connected to the second terminal 104 in the N type MOS transistor 20n. A control signal Vcnt is input to the gate of the MOS transistor 20n, and a control signal Vcnt' is input to the gate of the MOS transistor 20p, wherein the signals Vcnt and Vcnt' are output from a control unit 18.

The control unit 18 outputs a high level signal as the control signal Vcnt in a write mode, and outputs a low level signal in a read mode. Moreover, as the control signal Vcnt', a low level signal is output in a write mode, and a high level signal is output in a read mode. Thereby, the both of the MOS transistors 20n and 20p are turned off in the write mode, and are turned on in the read mode.

By providing the N type and P type MOS transistors in parallel as described above, the impedance Zr between the first terminal 102 and the second terminal 104 may be decreased in the write mode to reduce a voltage applied to the reproducing head 10.

Moreover, there may be considered, for example, a case in which a transistor is turned off because a voltage between the gate and the source of either of the MOS transistors is changed when both of the potential Vx of the reading interconnection Rx and the potential Vy of the reading interconnection Ry are changed by signal components caused by crosstalks. Here, the reproducing head 10 may be more securely protected because either of the transistors is continuously turned on by providing the two complementary transistors in parallel.

Though the impedance of the variable impedance element 20 has been set equal to the impedance Rmr of the reproducing head 10 in the embodiments, a setting is not limited to the above. The value of this impedance may be appropriately decided according to the breakdown voltage Vth of the reproducing head 10, the amplitude of a signal component caused by a crosstalk, and the like.

As the on resistance Ron of a MOS transistor is decided by the transistor size, that is, the gate length and the gate width when the variable impedance element 20 is formed with the MOS transistor, it is preferable to decide the on resistance Ron, further, in consideration of the area.

Moreover, another generally-used variable impedance element may be used as the variable impedance element 20 though cases in which the MOS transistor is used as the variable impedance element 20 as one example have been explained in the embodiments.

Moreover, the variable impedance element 20 and the control unit 18 may be integrated with the magnetic head driving circuit 200 as shown in FIG. 1, or the element 20 and the control unit 18 may be provided external to, and separated from the circuit 200. A configuration to be selected depends on the manufacturing processes, the required performances, the cost, and the like of a semiconductor.

Furthermore, the magnetic head driving circuit 200 according to the present embodiment, and the magnetic recording and reproducing device 100 using the same may be considered to be as follows: That is, the variable impedance element 20 may be considered to be a clamping element for voltage clamping by which a voltage applied to between the first terminal 102 and the second terminals 104, that is, to the reproducing head 10 becomes a predetermined voltage or less during the write mode, wherein each of the terminals 102 and 104 is to be connected to either of the ends of the reproducing head 10. Accordingly, a similar effect may be also obtained by operating, during the write mode, another circuit element with a voltage clamping function, instead of, or together with the variable impedance element, wherein the circuit element is provided in parallel with the reproducing head 10.

Though the magnetic recording and reproducing device 100 using the magnetic disk has been explained in the embodiments, the reproducing-head protection technology according to the embodiment is not limited to the above device 100, and, similarly, the technology may be also applied to a disk-type flexible-disk memory device, a helical-scanning-type image recording device (VTR), a card-type magnetic card, and the like as another magnetic recording medium.

While the preferred embodiments of the present invention have been described using specific terms, such description is for illustrative purposes only, and it is to be understood that changes and variations may be made without departing from the spirit or scope of the appended claims.

The invention claimed is:

1. A magnetic head driving circuit, comprising:
   a first and a second terminals each of which is to be connected to either of the ends of a reproducing head element;
   a variable impedance element which is connected to between said first and said second terminals in parallel with said reproducing head element; and
   a control unit arranged to increase the impedance of said variable impedance element during reproducing operation and to reduce the impedance of said variable impedance element during recording operation;
   whereby a difference in voltage between said first and second terminals otherwise caused during the recording operation is eased.

2. The magnetic head driving circuit according to claim 1, wherein
   the impedance of said variable impedance element during recording operation is set similar to, equal to, or smaller than that of said reproducing head element.

3. The magnetic head driving circuit according to claim 1, wherein
   said variable impedance element is a MOS transistor in which the drain is connected to said first terminal, the source is connected to said second terminal, and the gate is connected to said control unit.

4. The magnetic head driving circuit according to claim 1, wherein
   said variable impedance element includes:
   a P type MOS transistor in which the drain is connected to said first terminal, the source is connected to said second terminal, and the gate is connected to said control unit; and
   an N type MOS transistor in which the source is connected to said first terminal, the drain is connected to said second terminal, and the gate is connected to said control unit.

5. A magnetic head driving circuit, including:
   a first and a second terminals each of which is to be connected to either of the ends of a reproducing head element; and
   a voltage clamping element arranged to clamp a voltage between said first and said second terminals within a predetermined voltage; and
   a control unit arranged to disable said clamping element during reproducing operation and to enable said clamping element during recording operation;
   whereby a difference in voltage between said first and second terminals otherwise caused during the recording operation is eased.

6. The magnetic head driving circuit according to claim 1, wherein
   each component is integrated onto one semiconductor substrate.

7. A magnetic recording and reproducing device, wherein
   said device is provided with the magnetic head driving circuit according to claim 1.

8. A method of protecting a reproducing head in a magnetic recording and reproducing device which records data on a magnetic recording medium, and reproduces the data, comprising:
   providing a variable impedance element in parallel with said reproducing head;
   increasing the impedance of said variable impedance element during reproducing operation; and
   reducing the impedance of said variable impedance element during recording operation, whereby a voltage difference across both ends of said reproducing head otherwise caused during the recording operation is eased.

9. The magnetic head driving circuit according to claim 5, wherein
   each component is integrated onto one semiconductor substrate.

10. A magnetic recording and reproducing device comprising:
    a magnetic head driving circuit, including:
    a first and a second terminals each of which is to be connected to either of the ends of a reproducing head element; and a voltage clamping element arranged to clamp a voltage between said first and said second terminals within a predetermined voltage; and a control unit arranged to disable said clamping element during reproducing operation and to enable said clamping element during recording operation;

whereby a difference in voltage between said first and second terminals otherwise caused during the recording operation is eased.

* * * * *